US010689572B2

(12) United States Patent
Lee et al.

(10) Patent No.: US 10,689,572 B2
(45) Date of Patent: Jun. 23, 2020

(54) ETCHANT COMPOSITION WITH HIGH SELECTIVITY TO SILICON NITRIDE

(71) Applicants: LTCAM CO., LTD., Pyeongtaek-si, Gyeonggi-do (KR); SK Hynix Inc., Icheon-si, Gyeonggi-do (KR)

(72) Inventors: Sok Ho Lee, Yongin-si (KR); Jung Hwan Song, Seoul (KR); Seong Sik Jeon, Suwon-si (KR); Sung Il Jo, Daejeon (KR); Byeoung Tak Kim, Incheon (KR); Na Han, Seoul (KR); Ah Hyeon Lim, Daejeon (KR); Junwoo Lee, Jeollabuk-do (KR); Min Keun Lee, Seongnam-si (KR); Joon Won Kim, Seoul (KR); Hyungsoon Park, Icheon-si (KR); Pilgu Kang, Icheon-si (KR); Youngmee Kang, Icheon-si (KR); Suyeon Lee, Icheon-si (KR)

(73) Assignees: LTCAM CO., LTD., Pyeongtaek-si, Gyeonggi-do (KR); SK HYNIX INC., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/270,320

(22) Filed: Feb. 7, 2019

(65) Prior Publication Data

US 2019/0249082 A1      Aug. 15, 2019

(30) Foreign Application Priority Data

Feb. 9, 2018    (KR) .................. 10-2018-0016410

(51) Int. Cl.
*C09K 13/06* (2006.01)
*H01L 21/311* (2006.01)
*H01L 21/302* (2006.01)
*H01L 21/306* (2006.01)
*C09K 13/00* (2006.01)

(52) U.S. Cl.
CPC .............. *C09K 13/06* (2013.01); *C09K 13/00* (2013.01); *H01L 21/302* (2013.01); *H01L 21/30604* (2013.01); *H01L 21/31111* (2013.01)

(58) Field of Classification Search
None
See application file for complete search history.

(56) References Cited

FOREIGN PATENT DOCUMENTS

| KR | 10-2005-0003163 A | 1/2005 |
|---|---|---|
| KR | 10-2011-0037741 A | 4/2011 |
| KR | 10-2013-0016797 A | 2/2013 |
| KR | 10-2013-0068952 A | 6/2013 |
| KR | 10-2014-0079267 A | 6/2014 |
| KR | 101733289 B1 | 5/2017 |

*Primary Examiner* — Jiong-Ping Lu
(74) *Attorney, Agent, or Firm* — Rabin & Berdo, P.C.

(57) ABSTRACT

Provided is an etchant composition for a silicon nitride film, and more particularly, to an etchant composition with a high selectivity to a silicon nitride film, which is used to etch away a silicon nitride film in semiconductor process and which selectively has a high etching rate for the silicon nitride film compared to a silicon oxide film in a high temperature etch process, in which the etchant composition with the high selectivity selectively etches the silicon nitride film at a selectivity of 2000:1 or higher between the silicon nitride film and the silicon oxide film which are in a stack structure, and minimizes damages to the silicon oxide film and etching rate, and does not cause re-growth of the silicon oxide film over the process time.

6 Claims, No Drawings

ETCHANT COMPOSITION WITH HIGH SELECTIVITY TO SILICON NITRIDE

CROSS-REFERENCE TO RELATED APPLICATIONS

The present disclosure claims priority to Korean Patent Application No. 10-2018-0016410 in the Republic of Korea, the disclosures of which are incorporated herein by reference.

BACKGROUND

1. Field of the Disclosure

The present disclosure relates to an etchant composition for a silicon nitride film, and more particularly, to an etchant composition with a high selectivity to a silicon nitride film, which is used to etch away a silicon nitride film in semiconductor process and which selectively has a high etching rate for the silicon nitride film compared to a silicon oxide film in a high temperature etch process.

2. Description of the Related Art

The semiconductor manufacturing process requires a stack structure forming technique capable of continuously increasing an integration density through an introduction of a three-dimensional structure. In the semiconductor manufacturing process, a silicon oxide film ($SiO_2$) and a silicon nitride film (SiNx), which are representative insulating films, are stacked individually or stacked into one or more films in an alternate sequence and used, and such oxide film and the nitride film are also used as a hard mask for forming a conductive pattern such as a metal wiring. The silicon nitride film and the silicon oxide film are the main insulating films that form a stack structure for forming a three-dimensional NAND flash memory gate.

In order to form the stack structure, the silicon nitride film may be removed by wet etching process that uses an etchant or etchant composition containing phosphoric acid, for example. Further, depending on need for forming various patterns included in the semiconductor device, a process of selectively etching the silicon nitride film may be required. The etchant composition with a high selectivity is required for selective etching of the silicon nitride film over a silicon oxide film.

Korean Patent Application Publication No. 10-2005-0003163 discloses an etchant including phosphoric acid and hydrofluoric acid for a nitride film of a semiconductor device. However, when hydrofluoric acid is included in the etchant, this will cause removal of the silicon oxide film too, in which case it is not possible to ensure a sufficient etch selectivity to the nitride film over the oxide film, and there is a problem that the etchant may not be used in a pattern with a highly stacked structure, due to damage to the silicon oxide film, collapse of the pattern, re-growth of the silicon oxide film, and the like.

In addition, in the wet etching process for removing the nitride film, a mixture of phosphoric acid and deionized water is generally used. Deionized water is added to prevent decrease in the etching rate and change of the etching selectivity to the oxide film, but there is a problem that even a slight change in the amount of deionized water causes defects in the process of etching away the nitride film. In order to solve this problem, a technique has been known in the related art, which removes a nitride film by using an etchant composition that further contains hydrofluoric acid, nitric acid, and the like in addition to phosphoric acid, but it results in decreased etch selectivity of the nitride film and the oxide film.

Korean Patent Application Publication No. 10-2011-0037741 discloses a composition for etching the silicon nitride film, which further contains oxime silane in addition to phosphoric acid. However, since the composition has low solubility, there is a problem that particles are adsorbed and generated on a semiconductor substrate or the silicon oxide film.

In order to solve these problems, in the related art, a technique for increasing the selective etching rate by using an additive to suppress etching of the silicon oxide film, for example, a silicon oxide film etching inhibitor such as silicate, fluorosilicic acid, fluorosilicate or the like , or a silicon nitride film etching enhancer has been studied, and Korean Patent Application Publication No. 10-2013-0068952 discloses an etchant composition containing phosphoric acid, a silicon-fluorine compound containing a silicon-fluorine bond, a sulfonylimide-based adsorption inhibitor, a polymer-based adsorption inhibitor and water as a nitride-based etchant composition. However, there is a problem that the additive increases the silicon concentration in the composition and the silicon oxide film re-grows with the lapse of the process time.

SUMMARY

In order to solve the above problems, an etchant composition with a high selectivity is provided, which etches a silicon nitride film with a selectivity of 2000:1 or higher between the silicon nitride film and a silicon oxide film which are in a stack structure, and minimizes damage to the silicon oxide film and etching rate, and does not cause re-growth of the silicon oxide film over the process time.

In order to achieve the above object, the present disclosure has developed an etchant composition with a high selectivity to a silicon nitride film, which can etch the silicon nitride film at a constant rate, without having issue of re-growth of the silicon oxide film or damage to the silicon oxide film even after the elapse of the process time, and the present disclosure provides an etchant composition with a high selectivity to a silicon nitride film, which contains a compound expressed by Chemical Formula 1 or 2 described below and phosphoric acid, a silicone compound, an amino acid compound and water.

[Chemical Formula 1]

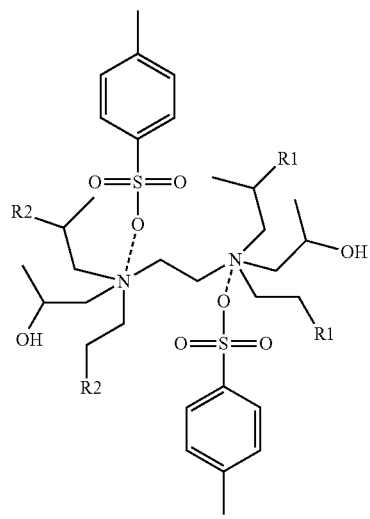

[Chemical Formula 2]

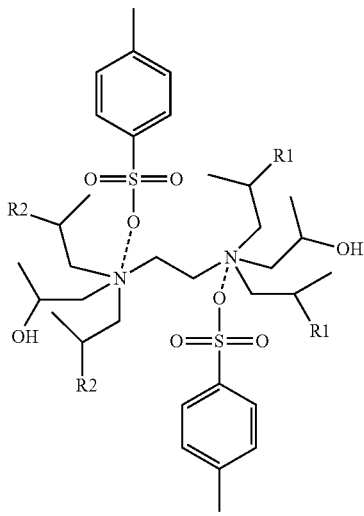

where, R1 and R2 are independently selected from hydrogen, a hydroxy group, an alkyl group or a carboxy group.

The alkyl group is $C_1$-$C_{10}$ alkyl, and refers to a radical of a saturated aliphatic group containing a straight chain alkyl group, a branched alkyl group, a cycloalkyl group, an alkyl substituted cycloalkyl group, and a cycloalkyl substituted alkyl group having from 1 to 10 carbon atoms.

The straight chain or branched alkyl group has 10 or fewer carbon atoms in its main chain.

Specifically, the alkyl group may be methyl, ethyl, n-propyl, i-propyl, n-butyl, s-butyl, i-butyl, t-butyl, pentyl, hexyl, benzyl and phenyl.

The present disclosure also provides an etchant composition with a high selectivity to a silicon nitride film, which may include, based on total weight, 60 to 85 wt % of phosphoric acid, 0.1 to 10 wt % of the compound of Chemical Formula 1 or 2, 0.001 to 5 wt % of the amino acid compound, and 0.005 to 1 wt % of the silicone compound, with the remainder being water.

The etchant composition selectively etches the silicon nitride film over the silicon oxide film.

Also, according to an embodiment of the present disclosure, there is provided an etchant composition with a high selectivity to a silicon nitride film, which has a selectivity of 2000:1 or higher between a silicon nitride film etching rate and a silicon oxide film etching rate.

According to the present disclosure, an etchant composition with a high selectivity selectively etches a silicon nitride film at a selectivity of 2000:1 or higher between the silicon nitride film and a silicon oxide film which are in a stack structure, and minimizes damages to the silicon oxide film and etching rate, and does not cause re-growth of the silicon oxide film over the process time.

DETAILED DESCRIPTION

Hereinafter, an etchant composition for use in semiconductor manufacturing will be described in greater detail, which has a high selectivity of etching rate to a silicon nitride film over a silicon oxide film according to a specific embodiment of the present disclosure. However, it will be apparent to those skilled in the art that this is not intended to limit the scope of the disclosure, but is set forth as an example of the disclosure, and that various modifications may be made to the embodiments within the scope of the disclosure. In the following Examples and Comparative Examples, the component ratio of the compositions is calculated in weight ratios unless otherwise specified. The etching rate expressed in the embodiment and the drawings of the present disclosure is not a numerical value proportional to the etchant composition evaluation time, and the etching rate and the selectivity can be expressed differently under the environment other than the evaluation conditions presented herein.

Preparation of Etchant Composition

Each of the embodiments for achieving the object of the present disclosure includes phosphoric acid and a compound expressed by Chemical Formula 1 or 2, a silicone compound, an amino acid, and water as a solvent.

[Chemical Formula 1]

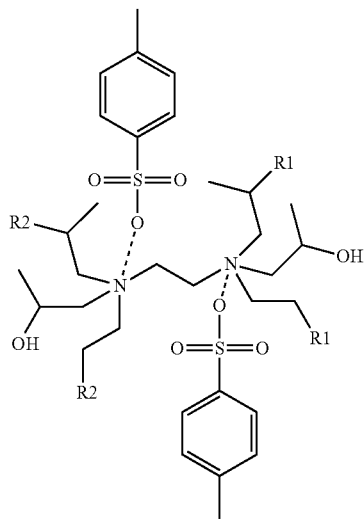

[Chemical Formula 2]

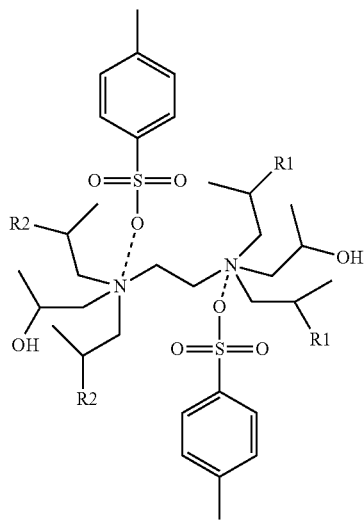

where, R1 and R2 are independently selected from hydrogen, a hydroxy group, an alkyl group or a carboxy group.

The alkyl group is $C_1$-$C_{10}$ alkyl, and refers to a radical of a saturated aliphatic group containing a straight chain alkyl group, a branched alkyl group, a cycloalkyl group, an alkyl substituted cycloalkyl group, and a cycloalkyl substituted alkyl group having from 1 to 10 carbon atoms.

The straight chain or branched alkyl group has 10 or fewer carbon atoms in its main chain.

Specifically, the alkyl group may be methyl, ethyl, n-propyl, i-propyl, n-butyl, s-butyl, i-butyl, t-butyl, pentyl, hexyl, benzyl and phenyl.

According to each embodiment, the etchant composition contains, based on the total composition, 60 to 85 wt % of phosphoric acid, 0.1 to 10 wt % of the compound of Chemical Formula 1 or 2, 0.001 to 5 wt % of the amino acid compound, 0.005 to 1 wt % of the silicone compound, and solvent, with the remainder being solvent and water.

In the following Examples and Comparative Examples, unless otherwise stated, the remainder of the composition is substituted with the weight of water in calculation. For example, in comparing the etching compositions for the purpose of preparation and evaluation of performance, phosphoric acid has to be maintained at a constant content relative to the total composition for the comparison of performance between the phosphoric acid content relative to the rest of the etchant composition.

The phosphoric acid acts as a main etching component for etching the nitride film, and 60 to 85 wt % of phosphoric acid is added based on the total composition. When phosphoric acid is contained in an amount of less than 60 wt %, the silicon nitride film is insufficiently removed, and the overall etching rate may be lowered. There is also a risk of particle generation. On the other hand, when phosphoric acid is contained in an amount exceeding 85 wt %, it is difficult to expect further enhancement of the effect from the content increase.

When the etchant composition further contains the compound of Chemical Formula 1 or 2, even when the composition for etching is used for a long period of time, the etching rate is not lowered and selectivity is not changed, and the etching rate is maintained constant. This also provides surface improvement and suppresses re-growth of silicon oxide film.

The compound of Chemical Formula 1 or 2 is preferably contained in an amount of 0.1 to 10 wt %, and when the compound is added in an amount of less than 0.1 wt %, the effect of maintaining the selectivity is decreased when the compound is used for a long period of time, and when the compound is added in an amount exceeding 10 wt %, the etching rate of the silicon nitride film and the silicon oxide film may be changed, which may result in a change in the selectivity. More preferably, the compound of Chemical Formula 1 or 2 is contained in an amount of 0.2 to 0.5 wt %.

The silicon compound is selected from among hexafluorosilicate, aluminum silicate, calcium silicate, tetraethylorthosilicate, tetraethyl orthosilicate, silicate, sodium fluorosilicate, sodium hexafluorosilicate, 3-aminopropyl trimethoxysilane, aminoethyl-aminotrimethoxysilane, and dichlorosilane. The silicon compound is contained in an amount of 0.005 to 1 wt%, and when the silicon compound is added in an amount of less than 0.005 wt%, a high etch selectivity to the silicon nitride film is not obtained, and when the silicon compound is added in an amount exceeding 1 wt%, it is difficult to expect further enhancement of the effect from the content increase, while there occurs a problem that particles are generated. More preferably, the silicone compound is contained in an amount of 0.3 to 0.5 wt%.

The amino acid compound is selected from among arginine, histidine, lysine, serine, threonine, asparagine, glutamine, alanine, valine, isoleucine, leucine, methionine, phenylalanine, tyrosine, tryptophan, cysteine, selenocysteine, glycine, proline, aspartic acid, glutamic acid, and 3-trifluoroalanine, and acts to protect the silicon nitride film which is an insulating film stack together with the silicon oxide film. When a commonly used corrosion inhibitor is used, the selective etching property of the silicon nitride film of the compound of Chemical Formula 1 or 2 described above is remarkably lowered, and if the etching property of the silicon nitride film is not lowered, then the silicon oxide film is not protected. However, when the amino acid compound is used, there is an effect that re-growth of the silicon oxide film can be suppressed by the chelation of the silic ions by etching of the silicon nitride film, which results in improved surface state of the silicon oxide film.

The amino acid compound is preferably contained in an amount of 0.001 to 5 wt % based on 100 wt % of the total composition. When the amino acid compound is added in an amount of less than 0.001 wt %, the protective performance against the silicon oxide film is lowered, and when the amino acid compound is added in an amount exceeding 5 wt %, the effect of improving the protection performance is not sufficient, and the etching performance of the silicon nitride film may also be deteriorated.

The etchant composition with a high selectivity to a silicon nitride film selectively etches the silicon nitride film over the silicon oxide film, so that the silicon nitride film is etched selectively without damaging the silicon oxide film, at a selectivity of 2000:1 or higher between the silicon nitride film etching rate and silicon oxide film etching rate. The excess water included in the etchant composition includes distilled water or deionized water (DIW), for example, and may be included as a remainder of the composition.

Evaluation of Etching Rate of Etchant Composition and Surface State

Each of the embodiments according to the present disclosure evaluates the etching rate by using an etchant composition containing phosphoric acid, a compound of Chemical Formula 1 or 2, a silicon compound, an amino acid, and water as a solvent. The etchant composition is added at an amount of 300 g and the temperature is raised up to 157° C., and then the water is controlled at a constant content to maintain phosphoric acid content. A silicon nitride film wafer for etching rate measurement, which is a wafer having a thickness of 5,000 Å, was prepared as a specimen having a width of 1 cm and a length of 4 cm for evaluation, from which the thickness before and after etching was measured. A silicon oxide film wafer for etching rate measurement, which is a wafer having a thickness of 10,000 Å, was prepared as a specimen having a width of 1 cm and a length of 4 cm for evaluation, from which the thickness before and after etching was measured. After introducing the silicon nitride film and the silicon oxide film into the etchant composition that has reached the steady state, etching rate was measured. The etching rate of the silicon nitride film and the silicon oxide film was calculated by the etching rate per minute, and the selectivity was calculated by the ratio of the silicon nitride film etching rate to the silicon oxide film etching rate.

$$\frac{A}{B} = C$$

[A: Etching rate of the silicon nitride film, B: Etching rate of the silicon oxide film, C: Selectivity]

In the following Examples and Comparative Examples, the surface state evaluation was performed by observing with a scanning electron microscope the surface state of the silicon oxide film subjected to the etching rate evaluation, and assigning the results of observation a state average score stepwise from 1 to 10. The surface state evaluation criterion assigns a step score mainly based on the size, shape and frequency of the re-growth particles. In the following step scores, '1' indicates the worst surface state and '10' indicates the best surface state.

Comparative Example 1

The etching rate was measured by using an etchant composition having a composition of 83 wt % of phosphoric acid. The result of the measurement revealed that the selectivity was low with the silicon nitride film of 124 Å/min and the silicon oxide film of 5.25 Å/min, and the improvement of the surface state was insufficient compared with the Examples.

Comparative Example 2

The etching rate was measured by using an etchant composition having a composition of 83 wt % of phosphoric acid and 0.2 wt % of the compound of Chemical Formula 1 or 2. The result of the measurement revealed that the selectivity was low with the silicon nitride film of 131 Å/min and the silicon oxide film of 4.81 Å/min, and the improvement of the surface state was insufficient compared with the Examples.

Example 1

The etching rate was measured by using an etchant composition having a composition of 83 wt % phosphoric acid, 0.2 wt % of the compound of Chemical Formula 1 or 2, 1 wt % of alanine, and 0.005 wt % of silicon compound. The result indicated a decrease in the etching rate of silicon oxide film with the silicon nitride film of 128 Å/min and the silicon oxide film of 2.14 Å/min, but revealed that selectivity was low and the surface state was not improved remarkably compared to the phosphoric acid of the Comparative Examples.

Example 2

The etching rate was measured by using an etchant composition having a composition of 83 wt % phosphoric acid, 0.2 wt % of the compound of Chemical Formula 1 or 2, 1 wt % of alanine, and 0.1 wt % of silicon compound. The result indicated a decrease in the etching rate of silicon oxide film compared with Comparative Examples 1 and 2 with the silicon nitride film of 129 Å/min and the silicon oxide film of 0.91 Å/min, but revealed that selectivity was as low as 60, and the surface state of the silicon oxide film was partially improved.

Example 3

The etching rate was measured by using an etchant composition having a composition of 83 wt % phosphoric acid, 0.2 wt % of the compound of Chemical Formula 1 or 2, 1 wt % of alanine, and 0.3 wt % of silicon compound. The result indicated a significant decrease in the etching rate of silicon oxide film compared with Comparative Examples 1 and 2 with the silicon nitride film of 115 Å/min and the silicon oxide film of 0.05 Å/min, but revealed that the etching rate selectivity of the silicon nitride film over the silicon oxide film was very high at about 2300 to 1. However, the step score of the silicon oxide film surface state was low compared to Examples 7 and 8 having the same selectivity.

Example 4

The etching rate was measured by using an etchant composition having a composition of 83 wt % phosphoric acid, 0.2 wt % of the compound of Chemical Formula 1 or 2, 1 wt % of alanine, and 0.5 wt % of silicon compound. The result indicated a significant decrease in the etching rate of silicon oxide film compared with Comparative Examples 1 and 2 with the silicon nitride film of 109 Å/min and the silicon oxide film of 0.02 Å/min, and also revealed that the etching rate of the silicon nitride film over the silicon oxide film was decreased at about 18 Å/min The etching rate selectivity of the silicon nitride film over the silicon oxide film was very high at 5450 to 1, but the stage score was low due to the generation of re-growth particles and the like in the silicon oxide film surface state.

Example 5

The etching rate was measured by using an etchant composition having a composition of 83 wt % phosphoric acid, 0.5 wt % of the compound of Chemical Formula 1 or 2, 1 wt % of alanine, and 0.05 wt % of silicon compound. The result indicated a decrease in the etching rate of silicon oxide film compared with Comparative Examples 1 and 2 with the silicon nitride film of 130 Å/min and the silicon oxide film of 2.56 Å/min, but revealed that selectivity was as low as 51. However, the surface state of the silicon oxide film had less re-growth particles and the shape thereof was improved compared to Examples 1, 2, 3 and 4.

Example 6

The etching rate was measured by using an etchant composition having a composition of 83 wt % phosphoric acid, 0.5 wt % of the compound of Chemical Formula 1 or 2, 1 wt % of alanine, and 0.1 wt % of silicon compound. The result indicated a decrease in the etching rate of silicon oxide film compared with Comparative Examples 1 and 2 with the silicon nitride film of 128 Å/min and the silicon oxide film of 1.12 Å/min, but revealed that selectivity was as low as 114, which was lower than that of Examples 3. 4, 7, and 8. However, the surface state of the silicon oxide film had less re-growth particles and the shape thereof was improved compared to Examples 1, 2, 3 and 4.

Example 7

The etching rate was measured by using an etchant composition having a composition of 83 wt % phosphoric acid, 0.5 wt % of the compound of Chemical Formula 1 or 2, 1 wt % of alanine, and 0.3 wt % of silicon compound. The result indicated a significant decrease in the etching rate of silicon oxide film compared with Comparative Examples 1 and 2 with the silicon nitride film of 125 Å/min and the silicon oxide film of 0.06 Å/min, but revealed that the etching rate selectivity of the silicon nitride film over the silicon oxide film was very high at about 2083 to 1. The surface state of the silicon oxide film also had no re-growth particles, and the shape thereof was improved and had a clean surface. 0.3 wt % of silicon compound may be used to lower the etching rate of the silicon oxide film, and 0.5 wt % of the compound of Chemical Formula 1 or 2 may be used to improve the surface and suppress re-growth of the silicon oxide film.

Example 8

The etching rate was measured by using an etchant composition having a composition of 83 wt % phosphoric acid, 0.5 wt % of the compound of Chemical Formula 1 or 2, 1 wt % of alanine, and 0.5 wt % of silicon compound. The result indicated a significant decrease in the etching rate of silicon oxide film compared with Comparative Examples 1 and 2 with the silicon nitride film of 117 Å/min and the silicon oxide film of 0.05 Å/min, but revealed that the etching rate selectivity of the silicon nitride film over the silicon oxide film was very high at about 2340 to 1. The surface state of the silicon oxide film also had no re-growth particles, and the shape thereof was improved and had a clean surface. 0.5 wt % of silicon compound may be used to lower the etching rate of the silicon oxide film, and 0.5 wt % of the compound of Chemical Formula 1 or 2 may be used to improve the surface and suppress re-growth of the silicon oxide film.

Example 9

The etching rate was measured by using an etchant composition having a composition of 83 wt % phosphoric acid, 0.5 wt % of the compound of Chemical Formula 1 or 2, 2 wt % of alanine, and 0.05 wt % of silicon compound. The result indicated a decrease in the etching rate of silicon oxide film compared with Comparative Examples 1 and 2 with the silicon nitride film of 136 Å/min and the silicon oxide film of 3.25 Å/min, but revealed that selectivity was as low as 42. The surface state of the silicon oxide film had reduced re-growth particles and improved surface compared to Examples 1, 2, 3, and 4 having 0.2 wt % of the compound of Chemical Formula 1 or 2 and 1 wt % of alanine. Comparing Example 1 with Example 9 can prove that the increased amount of the compound of Chemical Formula 1 or 2 and alanine is effective in improving the surface state of the silicon oxide film.

Example 10

The etching rate was measured by using an etchant composition having a composition of 83 wt % phosphoric acid, 0.5 wt % of the compound of Chemical Formula 1 or 2, 2 wt % of alanine, and 0.1 wt % of silicon compound. The result indicated a decrease in the etching rate of silicon oxide film compared with Comparative Examples 1 and 2 with the silicon nitride film of 130 Å/min and the silicon oxide film of 2.24 Å/min, but revealed that selectivity was as low as 58. The surface state of the silicon oxide film had reduced re-growth particles and improved surface compared to Examples 1, 2, 3, and 4 having 0.2 wt % of the compound of Chemical Formula 1 or 2 and 1 wt % of alanine. Comparing Example 2 with Example 10 can prove that the increased amount of the compound of Chemical Formula 1 or 2 and alanine is effective in improving the surface state of the silicon oxide film.

Example 11

The etching rate was measured by using an etchant composition having a composition of 83 wt % phosphoric acid, 0.5 wt % of the compound of Chemical Formula 1 or 2, 2 wt % of alanine, and 0.3 wt % of silicon compound. The result indicated a decrease in the etching rate of silicon oxide film compared with Comparative Examples 1 and 2 with the silicon nitride film of 127 Å/min and the silicon oxide film of 0.75 Å/min, but revealed that selectivity was as low as 169, which was lower than that of Examples 3. 4, 7, and 8. The surface state of the silicon oxide film had reduced re-growth particles and improved surface compared to Examples 1, 2, 3, and 4 having 0.2 wt % of the compound of Chemical Formula 1 or 2 and 1 wt % of alanine. Although selectivity between a silicon nitride film etching rate and a silicon oxide film etching rate was not improved, but comparing Example 3 with Example 11 can prove that the increased amount of the compound of Chemical Formula 1 or 2 and alanine is effective in improving the surface state of the silicon oxide film.

Example 12

The etching rate was measured by using an etchant composition having a composition of 83 wt % phosphoric acid, 0.5 wt % of the compound of Chemical Formula 1 or 2, 2 wt % of alanine, and 0.5 wt % of silicon compound. The result indicated a decrease in the etching rate of silicon oxide film compared with Comparative Examples 1 and 2 with the silicon nitride film of 125 Å/min and the silicon oxide film of 0.56 Å/min, but revealed that selectivity was as low as 223, which was lower than that of Examples 3. 4, 7, and 8. The surface state of the silicon oxide film had reduced re-growth particles and improved surface compared to Examples 1, 2, 3, and 4 having 0.2 wt % of the compound of Chemical Formula 1 or 2 and 1 wt % of alanine. Although selectivity between a silicon nitride film etching rate and a silicon oxide film etching rate was not improved, but comparing Example 4 with Example 12 can prove that the increased amount of the compound of Chemical Formula 1 or 2 and alanine is effective in improving the surface state of the silicon oxide film.

TABLE 1

| | Phosphoric acid | Compound of Chemical Formula 1 or 2 | Alanine | Silicon Compound | Silicon Nitride Film | Silicon Oxide Film | Selectivity | Surface State |
|---|---|---|---|---|---|---|---|---|
| Comparative Example 1 | 83 | — | — | — | 124 | 5.25 | 24 | 2 |
| Comparative Example 2 | 83 | 0.2 | 1 | — | 131 | 4.81 | 27 | 4 |
| Example 1 | 83 | 0.2 | 1 | 0.05 | 128 | 2.14 | 60 | 5 |
| Example 2 | 83 | 0.2 | 1 | 0.1 | 129 | 0.91 | 142 | 6 |
| Example 3 | 83 | 0.2 | 1 | 0.3 | 115 | 0.05 | 2300 | 6 |

TABLE 1-continued

| | Phosphoric acid | Compound of Chemical Formula 1 or 2 | Alanine | Silicon Compound | Silicon Nitride Film | Silicon Oxide Film | Selectivity | Surface State |
|---|---|---|---|---|---|---|---|---|
| Example 4 | 83 | 0.2 | 1 | 0.5 | 109 | 0.02 | 5450 | 5 |
| Example 5 | 83 | 0.5 | 1 | 0.05 | 130 | 2.56 | 51 | 7 |
| Example 6 | 83 | 0.5 | 1 | 0.1 | 128 | 1.12 | 114 | 8 |
| Example 7 | 83 | 0.5 | 1 | 0.3 | 125 | 0.06 | 2083 | 10 |
| Example 8 | 83 | 0.5 | 1 | 0.5 | 117 | 0.05 | 2340 | 9 |
| Example 9 | 83 | 0.5 | 2 | 0.05 | 136 | 3.25 | 42 | 7 |
| Example 10 | 83 | 0.5 | 2 | 0.1 | 130 | 2.24 | 58 | 7 |
| Example 11 | 83 | 0.5 | 2 | 0.3 | 127 | 0.75 | 169 | 9 |
| Example 12 | 83 | 0.5 | 2 | 0.5 | 125 | 0.56 | 223 | 9 |

Table 1 shows the etching rates of the silicon nitride film and the silicon oxide film, and the surface state of the silicon oxide film in Examples and Comparative Examples according to the present disclosure.

When a certain amount of phosphoric acid, the compound of Chemical Formula 1 or 2, alanine and the silicon compound are contained at the content ratio according to the present disclosure, a low level of the silicon oxide film rate may be realized compared to Comparative Examples 1 and 2. The etching rate of the silicon oxide film is inversely proportional to the content of the silicon compound, which may lead to a high selectivity of etching rate to the silicon nitride film. As indicated by the comparison between Examples 1 and 9, between Example 2 and 10, between Example 3 and 11, and between Example 4 and 12, the increase in alanine content, which is a compound of Chemical Formula 1 or 2 and an amino acid compound, may suppress the silicon oxide film surface re-growth and protect the surface.

According to the present disclosure, the composition for etching containing the phosphoric acid, the compound of Chemical Formula 1 or 2, the silicon compound, the amino acid compound and the solvent may realize a selectivity of etching rate of 2000:1 or higher between the silicon nitride film etching rate and the silicon oxide film etching rate and suppress re-growth of the surface of the silicon oxide film.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

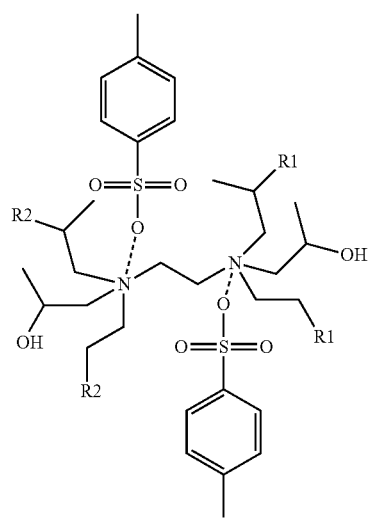

Chemical Formula 1

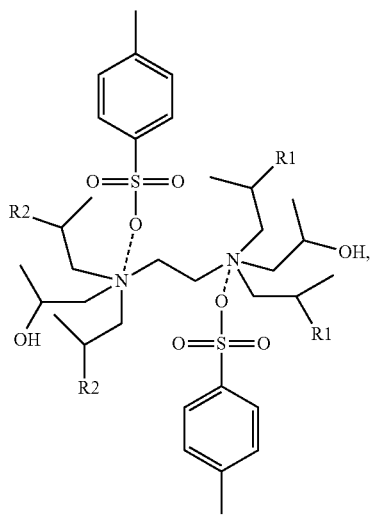

Chemical Formula 2 where R1 and R2 are independently selected from hydrogen, a hydroxy group, an alkyl group or a carboxy group;
phosphoric acid;
a silicon compound;
an amino acid compound; and
water.

2. The etchant composition according to claim 1, comprising, based on total weight of the composition,

What is claimed is:

1. An etchant composition with a selectivity to a silicon nitride film provided over a silicon oxide film, comprising:
a compound expressed by Chemical Formula 1 or Chemical Formula 2 described below 60 to 85 wt% of the phosphoric acid,
0.1 to 10 wt% of the compound of Chemical Formula 1 or Chemical Formula 2,
0.001 to 5 wt% of the amino acid compound,
0.005 to 1 wt% of the silicone compound, and
remainder water.

3. The etchant composition according to claim 1, wherein the silicon compound is selected from the group consisting of hexafluorosilicate, aluminum silicate, calcium silicate, tetraethylorthosilicate, silicate, sodium fluorosilicate, sodium hexafluorosilicate, 3-aminopropyl trimethoxysilane, aminoethyl-aminotrimethoxysilane, and dichlorosilane.

4. The etchant composition according to claim 1, wherein the amino acid compound is selected from the group consisting of arginine, histidine, lysine, serine, threonine, asparagine, glutamine, alanine, valine, isoleucine, leucine, methionine, phenylalanine, tyrosine, tryptophan, cysteine, selenocysteine, glycine, proline, aspartic acid, glutamic acid, and 3-trifluoroalanine.

5. The etchant composition according to claim 1, wherein the etchant composition selectively etches the silicon nitride film provided over the silicon oxide film.

6. The etchant composition according to claim 1, wherein the selectivity of the composition is 2000:1 or higher between a silicon nitride film etching rate and a silicon oxide film etching rate.

\* \* \* \* \*